US008370562B2

(12) United States Patent
Lasser

(10) Patent No.: US 8,370,562 B2
(45) Date of Patent: Feb. 5, 2013

(54) INTERRUPTIBLE CACHE FLUSHING IN FLASH MEMORY SYSTEMS

(75) Inventor: Menahem Lasser, Kohav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 556 days.

(21) Appl. No.: 11/876,893

(22) Filed: Oct. 23, 2007

(65) Prior Publication Data

US 2008/0209109 A1 Aug. 28, 2008

Related U.S. Application Data

(60) Provisional application No. 60/891,510, filed on Feb. 25, 2007.

(51) Int. Cl.
*G06F 12/02* (2006.01)
*G06F 12/08* (2006.01)

(52) U.S. Cl. ............... 711/103; 365/185.03; 711/135; 711/143; 711/173; 711/E12.008; 711/E12.019

(58) Field of Classification Search ............... 711/140, 711/169, E12.049–E12.051
See application file for complete search history.

(56) References Cited

U.S. PATENT DOCUMENTS

| | | | | |
|---|---|---|---|---|
| 4,843,542 | A * | 6/1989 | Dashiell et al. | 711/119 |
| 5,045,996 | A * | 9/1991 | Barth et al. | 711/143 |
| 5,404,485 | A | 4/1995 | Ban | |
| 5,640,529 | A * | 6/1997 | Hasbun | 711/103 |
| 5,805,501 | A * | 9/1998 | Shiau et al. | 365/185.29 |
| 5,860,124 | A | 1/1999 | Matthews et al. | |
| 5,930,167 | A * | 7/1999 | Lee et al. | 365/185.03 |
| 5,937,424 | A * | 8/1999 | Leak et al. | 711/103 |
| 5,937,425 | A | 8/1999 | Ban | |
| 6,189,070 | B1 * | 2/2001 | See et al. | 711/103 |
| 6,456,528 | B1 * | 9/2002 | Chen | 365/185.03 |
| 6,781,877 | B2 | 8/2004 | Cernea et al. | |
| 7,916,534 | B2 * | 3/2011 | Shimizu et al. | 365/185.03 |
| 2003/0021149 | A1 | 1/2003 | So et al. | |
| 2004/0073751 | A1 * | 4/2004 | Horrigan et al. | 711/135 |
| 2005/0273562 | A1 | 12/2005 | Moyer | |
| 2007/0005900 | A1 | 1/2007 | Horrigan et al. | |
| 2007/0061502 | A1 | 3/2007 | Lasser et al. | |
| 2007/0079065 | A1 * | 4/2007 | Bonella et al. | 711/113 |
| 2007/0186065 | A1 | 8/2007 | Lee et al. | |

FOREIGN PATENT DOCUMENTS

WO WO 2007/029259 3/2007

OTHER PUBLICATIONS

David A. Patterson and John L. Hennessy. Computer Organization and Design. 1998. Morgan Kaufmann. 2nd ed. p. 111.*
Hsien-Hsin S. Lee, Gary S. Tyson, and Matthew K. Farrens. "Eager Writeback—a Technique for Improving Bandwidth Utilization." Dec. 2000. IEEE. MICRO 2000.*
Keun Soo Yim. "A Novel Memory Hierarchy for Flash Memory Based Storage Systems." Dec. 2005. Journal of Semiconductor Technology and Science. vol. 5. pp. 262-269.*
Garbage Collection from Wikpedia the free encyclopedia Jul. 17, 2007 pp. 1-11.
U.S. Appl. No. 11/219,826, filed Sep. 2005, SanDISK.
International Search Report and Written Opinion from International Application No. PCT/IL2008/000216 dated Jul. 2, 2008, 12 pages.
Office Action issued Jan. 19, 2012 in Taiwanese Application No. 097106476 with English translation, 12 pages.
Office Action issued on Aug. 16, 2012 in Taiwanese Application No. 097106476 with English translation, 13 pages.

* cited by examiner

*Primary Examiner* — Nathan Sadler
(74) *Attorney, Agent, or Firm* — Toler Law Group, PC

(57) ABSTRACT

Cache flushing is effected for a flash memory by copying, to a block of the memory, first and second portions of cached data, and servicing a host access in-between copying the first portion and the second portion. Either both portions are selected before the copying, or erasing the block is forbidden until after the copying, or a portion of the block left unwritten by the first copying remains unwritten until after the host access is serviced.

18 Claims, 4 Drawing Sheets

INTERRUPTIBLE CACHE FLUSHING IN FLASH MEMORY SYSTEMS

This patent application claims the benefit of U.S. Provisional Patent Application No. 60/891,510, filed Feb. 25, 2007

FIELD AND BACKGROUND OF THE INVENTION

The present invention relates generally to the field of flash memory devices. More particularly, the present invention relates to managing and operation of copying data stored temporarily in a cache of a flash memory device into a new location in the flash memory device, an operation commonly known as "cache flushing".

Herein the terms "memory" and "storage" are used interchangeably and have the same meaning. Consequently, compound phrases containing those two terms (such as "memory device" and "storage device", or "memory system" and "storage system") also have the same meaning.

In the present invention the terms "controlling mechanism" and "controller" are used interchangeably and have the same meaning.

Herein, the term "block" is defined as the smallest unit of a flash memory that can be erased in a single operation. The term "page" is defined herein as the smallest unit of a flash memory that can be written (also called "programmed") in a single operation. Typically, a block contains many pages.

Herein, the terms "flash management system" and "flash file system" are synonyms and are used interchangeably. Each of these terms refers to a software module that manages the storage of data in a flash memory device, regardless of whether the interface exported by the module is file-oriented (with commands like "open file" or "write file") or block-oriented (with commands like "read block" or "write block"), and regardless of whether the software module runs on a controller dedicated solely to flash management or on the same host computer as that on which the applications that use the storage system are running.

A flash memory system implemented as a Multi-Level Cell (MLC) flash memory is provided for storing more than one bit of data in each memory cell. The writing of data into an MLC flash memory is typically slower than the writing of data into a Single-Level Cell (SLC) flash memory that stores only one bit of data per cell. Therefore, a storage system based on an MLC flash memory might not be capable of recording a stream of incoming data transmitted to the storage system at a high writing rate.

Typically in cases in which data are produced at a rate too high to be directly stored, a cache memory mechanism is provided, and is designed to operate fast enough to handle the incoming data stream. A cache memory utilizing a second (and faster) memory is implemented between the input data source and the main (and is slower) memory of the flash memory device. The input data stream is first written into the faster cache memory, and at a later stage is copied from this faster cache memory into the main memory. As the copying operation between the cache memory and the main memory is typically performed in the background, this operation does not have to meet the strict performance conditions imposed by the input data stream rate, and therefore the lower write performance of the main memory is no longer an obstacle.

However, the implementation of a second memory for caching has its drawbacks. Such an implementation requires additional components for the cache memory and its control, thereby complicating the design and management of the memory system.

The prior art includes U.S. Pat. No. 5,930,167 to Lee et al., which teaches a memory method and system for caching write operations in a flash memory storage system while achieving the benefits of caching in MLC flash memories but with fewer of the disadvantages. The MLC flash memory medium of the Lee patent is configured to operate as its own cache memory. This is possible because memory cells that store multiple bits can be configured to also operate similar to SLC memory cells and store only a single bit each, which is an easier task from a technological point of view. As a result, the MLC memory cells can be implemented to achieve the faster write performance that characterizes an SLC flash memory. This Lee et al. patent is incorporated by reference for all purposes as if fully set forth herein.

Techniques known in the art, such as that disclosed in the Lee et al. patent, provide a "built-in" faster cache memory embedded within the MLC flash memory storage system. When data bits are received for storage, these bits are first written into memory cells that are set to operate in SLC mode. This first writing operation can be is done relatively fast. Following this operation, in the background and when time permits it, the data bits are copied from the SLC cells into memory cells that are set to operate in MLC mode. Thus, as the system is designed to employ the higher storage density of the MLC flash memory storage system, the system further handles the faster input stream that could not be handled without the cache memory mechanism.

There are two ways to configure a flash memory system that utilizes such an SLC caching scheme:

A. A dedicated cache method: a specific portion of the memory cells is always allocated to operate in SLC mode, while other cells are allocated to operate in MLC mode only. In other words, while memory cells operating in SLC mode (SLC cells) and memory cells operating in MLC mode (MLC cells) co-exist within the storage system at the same time, each specific memory cell is allocated to either always operate in SLC mode or to always operate in MLC mode, and cannot be alternately allocated to operate in SLC mode at one point in time and in MLC mode at another point in time.

B. A mixed cache method: at least some of the memory cells change modes during the system's operation. That is—a specific memory cell is allocated to operate in SLC mode at one point in time and utilized for caching data, while at another point in time the same memory cell is allocated to operate in MLC mode and utilized for high density data storage in the main memory.

Whenever there is a reference herein to a cache, the cache can be either a mixed cache or a dedicated cache.

The dedicated cache method is much simpler to manage in flash memory systems than the mixed cache method. Each portion of the memory cells is pre-allocated to operate either in SLC mode or in MLC mode. Therefore, no real-time mode switching is required. Furthermore, there is no need to provide an information management module for storing and detecting the current operation mode of any memory portion.

The Lee et al. patent discloses a cache implementation that uses the mixed cache method. US Patent Application Publication No. 2007/0061502 to Lasser discloses a cache implementation that uses the dedicated cache method. The Lasser Application is incorporated by reference for all purposes as if fully set forth herein.

However, both cache implementation methods (i.e. the mixed cache method and the dedicated cache method) suffer from disadvantages explained below.

As explained above, the way a cache memory in a flash memory operates is the following—incoming data are written into the faster-to-write cache storage locations. Later, either when there is idle time or when the cache memory is fill and free space must be cleared, the data are read out of the cache memory and written into the slower-to-write main storage locations. After the data have been copied, the data no longer need to be stored in the cache memory and can be deleted so as to make the space occupied by the data available for new incoming data.

The operation of copying data from the cache memory into the main storage area and then clearing the copied area in the cache memory is referred to herein as "cache flushing". Cache flushing is typically a relatively time-consuming operation, as this operation includes both the writing of data into the slow-to-write MLC main memory area and the erasing of the copied data from the cache memory area, both operations typically being much slower than reading or even writing data into the SLC cache. But there is an even more important reason for any occurrence of cache flushing to be a long operation—for reasons having to do with the efficiency of the algorithms of cache management it is most cost-effective for the overall performance and efficiency of the storage device to carry out cache flushing tasks a full block at a time. In other words, in prior art systems whenever the flash management system decides to allocate time to cache flushing (moving data from cache to non-cache storage area) the flash management system fills at least a full block of non-cache storage at a time.

The operation of cache flushing in prior art flash management systems will be better understood by referring to FIG. 1, which is a high level flow-chart of flash management operation according to the prior art. In block 10, the flash management system checks whether a service request from the host is pending. If such a request is pending, the flash management system checks in block 12 whether the service can be provided without cache flushing. For example, a service request to store new data can be serviced only if there is room in the cache to receive the new data. If the service can be provided without cache flushing, the service is provided in block 14 and the operation returns to block 10. If such a request is not pending, the flash management system checks in block 16 whether there is useful cache flushing to be done. If there is no useful caching to be done, the operation returns to block 10. If there is useful cache flushing to be done (e.g. moving data from cache to main storage during idle time) or if the service requested by the host requires prior cache flushing (e.g. if the cache is too full to receive new data), a memory block is selected for cache flushing in block 18 and cache flushing is performed for the whole block in block 20. As can be seen from FIG. 1, once cache flushing has been started for a block, the cache flushing is brought to completion before any further host request is serviced, "starving" the host as long as the cache flushing operation of the current block is in progress.

The advantage of doing cache flushing using large "quanta" the size of a block is easy to understand—during the filling of a block by copying data into the block, the memory system is in a vulnerable state—the same data appear more than once within the storage space, data of adjacent pages are located in different types of storage cells, management tables pointing to where each page of data is to be found are not updated yet and do not correctly reflect the instantaneous state of the storage system, etc. Therefore, designers of prior art flash memory systems always have preferred to complete such vulnerable transitions atomically, and not allow other tasks to interfere with them by running concurrently. For example, new input data arriving from the host are not accepted and are not stored in the flash memory while a cache flushing task is taking place. Either the new data are held in a RAM buffer or the host is signaled to wait for "permission" to send in new data, or some other similar arrangement suitable for the architecture of the specific flash memory system is implemented.

This design decision, of treating the cache flushing into a block (or in some systems some integral number of blocks) as an atomic uninterruptible operation, has its price in the behavior of the memory system. As indicated above, the filling of a block of flash memory is slow compared to reading out of such memory. If for example a block contains 128 pages, each page having an average programming (writing) time of 750 microseconds, then writing a full block consumes at least 96 milliseconds. Taking also into account the time for reading those 128 pages from memory (either from the cache or from other storage area) and some overhead of the managing software, one gets to a cache flushing time for a block of well over 100 milliseconds.

The effect of this is that in systems such as the system of the above example once in a while the storage system might have a "hiccup" of over 100 milliseconds while completing a cache flushing task. The host computer accessing the storage system is held back for that period of time, until allowed to continue with sending a flow of new data into storage. Depending on the application utilizing the storage, such hiccups may be observable to a human user or may go unnoticed. Most appliances or host computers are well-prepared for such hiccups and know how to handle them without causing a noticeable disturbance. One common technique is the use of data buffering in the host memory, accumulating new data until the hiccup ends and the buffered data may be sent out into the storage device. This is why most users are not aware of the cache flushing issues—the appliances they operate are designed to shield them from users' view. But even if the appliance does not do a good job in shielding the hiccup, a hiccup of 100 milliseconds is short enough to be almost unnoticed by a human user.

However, in recent years the problem of cache flushing hiccups in flash management systems has become more severe and more difficult to be dismissed as just a slight inconvenience in the worst case. This is caused by two developments:

A. Cache flushing time has become longer than we were used to before. One reason is that in new generations of flash devices the size of a block has become larger. If just a few years ago a typical block of NAND flash memory was 16 Kbytes, now one can find flash devices having blocks of 512 MBytes and even more. Additionally, the programming time of a page also has becoming slower. This is caused by the effects of shrinking device technology to smaller geometries, and also by moving to devices storing multiple bits per cell. The more bits stored per cell, the longer the programming time becomes. Therefore the time to fill a block of flash memory in modern-day flash memory devices is longer than it used to be.

B. Some of the most popular communication protocols employed in memory cards impose a strict upper limit on response time to some commands. For example, the popular SecureDigital (SD) standard requires an SD-compliant card to always respond to a host write command within no more than 250 milliseconds. If a card does not meet this strict timeout, a host might terminate the communication session with the card and abort the data storage operation.

Obviously, the combined effect of the above developments creates a difficulty for flash memory systems designers. A cache flushing hiccup must not be longer than a protocol-imposed timeout limit, while the minimum time for a cache flushing task gets dangerously close to the limit. The problem is faced mainly by designers of flash management software of memory cards controllers, but it is also of importance for designers of flash controllers that do not necessarily operate inside memory cards, and even for designers of flash memory management software running on a host computer as part of a software driver for a flash memory device. In those cases in which there is no hard limit imposed by a communication protocol, the problem is not a malfunction of the system but a disturbing effect that is noticeable to the user.

Therefore, it is desirable to provide a storage system whose flash management system performs efficient cache flushing, while avoiding the hiccup problems resulting from the relatively long time of cache flushing common in the prior art techniques.

SUMMARY OF THE INVENTION

According to the present invention there is provided a method of storing data in a memory device that includes a flash memory, including the steps of: (a) storing the data in a cache within the flash memory; (b) selecting at least a portion of the data for copying to a block of the flash memory that is separate from the cache; (c) copying a first subportion of the at least portion of the data from the cache to the block; (d) subsequent to the copying of the first subportion, servicing an access of the memory device by a host of the memory device; and (e) subsequent to the servicing, copying a second subportion of the at least portion of the data from the cache to the block.

According to the present invention there is provided a method of storing data in a memory device that includes a flash memory, including the steps of: (a) storing the data in a cache within the flash memory; (b) copying a first portion of the data from the cache to a block of the flash memory that is separate from the cache; (c) subsequent to the copying of the first portion of the data, servicing an access of the memory device by a host of the memory device; and (d) subsequent to the servicing, copying a second portion of the data from the cache to the block; wherein the block is not erased between the copying of the first portion of the data and the copying of the second portion of the data.

According to the present invention there is provided a method of storing data in a memory device that includes a flash memory, including the steps of: (a) storing the data in a cache within the flash memory; (b) copying a first portion of the data from the cache to a block of the flash memory that is separate from the cache; (c) subsequent to the copying of the first portion of the data, servicing an access of the memory device by a host of the memory device; and (d) subsequent to the servicing, copying a second portion of the data from the cache to the block; wherein the copying of the first portion of the data leaves a portion of the block unwritten, and wherein all of the portion of the block remains unwritten until after the servicing.

According to the present invention there is provided a memory device including: (a) a flash memory; and (b) a controller operative to store data in the memory device by steps including: (i) storing the data in a cache within the flash memory, (ii) selecting at least a portion of the data for copying to a block of the flash memory that is separate from the cache, (iii) copying a first subportion of the at least portion of the data from the cache to the block, (iv) subsequent to the copying of the first subportion, servicing an access of the memory device by a host of the memory device, and (v) subsequent to the servicing, copying a second sub portion of the at least portion of the data from the cache to the block.

According to the present invention there is provided a system including: (a) a memory device that includes a flash memory; (b) a nonvolatile memory wherein is stored driver code for the memory device, the driver code including code for storing data in the memory device, the code for storing the data in the memory device including: (i) code for storing the data in a cache within the flash memory, (ii) code for selecting at least a portion of the data for copying to a block of the flash memory that is separate from the cache, (iii) code for copying a first subportion of the at least portion of the data from the cache to the block, (iv) code for accessing the flash memory subsequent to the copying of the first subportion, and (v) code for copying a second subportion of the at least portion of the data from the cache to the block subsequent to the accessing; and (c) a processor for executing the code.

According to the present invention there is provided a computer-readable storage medium having computer-readable code embedded thereon, the computer-readable code being driver code for a memory device that includes a flash memory and a control data structure for managing the flash memory, the computer-readable code including program code for storing data in the memory device, the program code for storing the data in the memory device including: (a) program code for storing the data in a cache within the flash memory; (b) program code for selecting at least a portion of the data for copying to a block of the flash memory that is separate from the cache; (c) program code for copying a first subportion of the at least portion of the data from the cache to the block; (d) program code for accessing the flash memory subsequent to the copying of the first subportion; and (e) program code for copying a second subportion of the at least portion of the data from the cache to the block subsequent to the accessing.

According to the present invention there is provided a memory device including: (a) a flash memory; and (b) a controller operative to store data in the memory device by steps including: (i) storing the data in a cache within the flash memory, (ii) copying a first portion of the data from the cache to a block of the flash memory that is separate from the cache, (iii) subsequent to the copying of the first portion of the data: servicing an access of the memory device by a host of the memory device, and (iv) subsequent to the servicing: copying a second portion of the data from the cache to the block; wherein the block is not erased between the copying of the first portion of the data and the copying of the second portion of the data.

According to the present invention there is provided a system including: (a) a memory device that includes a flash memory; (b) a nonvolatile memory wherein is stored driver code for the memory device, the driver code including code for storing data in the memory device, the code for storing the data in the memory device including: (i) code for storing the data in a cache within the flash memory, (ii) code for copying a first portion of the data from the cache to a block of the flash memory that is separate from the cache, (iii) code for accessing the flash memory subsequent to the copying of the first portion of the data, and (iv) code for copying a second portion of the data from the cache to the block subsequent to the accessing, wherein the block is not erased between the copying of the first portion of the data and the copying of the second portion of the data; and (c) a processor for executing the code.

According to the present invention there is provided a computer-readable storage medium having computer-readable code embedded thereon, the computer-readable code being driver code for a memory device that includes a flash memory and a control data structure for managing the flash memory, the computer-readable code including program code for storing data in the memory device, the program code for storing the data in the memory device including: (a) program code for storing the data in a cache within the flash memory; (b) program code for copying a first portion of the data from the cache to a block of the flash memory that is separate from the cache; (c) program code for accessing the flash memory subsequent to the copying of the first portion of the data; and (d) program code for copying a second portion of the data from the cache to the block subsequent to the accessing; wherein the block is not erased between the copying of the first portion of the data and the copying of the second portion of the data.

According to the present invention there is provided a memory device including: (a) a flash memory; and (b) a controller operative to store data in the memory device by steps including: (i) storing the data in a cache within the flash memory, (ii) copying a first portion of the data from the cache to a block of the flash memory that is separate from the cache, (ii) subsequent to the copying of the first portion of the data: servicing an access of the memory device by a host of the memory device, and (iv) subsequent to the servicing: copying a second portion of the data from the cache to the block; wherein the copying of the first portion of the data leaves a portion of the block unwritten, and wherein all of the portion of the block remains unwritten until after the servicing.

According to the present invention there is provided a system including: (a) a memory device that includes a flash memory; (b) a nonvolatile memory wherein is stored driver code for the memory device, the driver code including code for storing data in the memory device, the code for storing the data in the memory device including: (i) code for storing the data in a cache within the flash memory, (ii) code for copying a first portion of the data from the cache to a block of the flash memory that is separate from the cache, (iii) code for accessing the flash memory subsequent to the copying of the first portion of the data, and (iv) code for copying a second portion of the data from the cache to the block subsequent to the accessing, wherein the copying of the first portion of the data leaves a portion of the block unwritten, and wherein all of the portion of the block remains unwritten until after the accessing; and (c) a processor for executing the code.

According to the present invention there is provided a computer-readable storage medium having computer-readable code embedded thereon, the computer-readable code being driver code for a memory device that includes a flash memory and a control data structure for managing the flash memory, the computer-readable code including program code for storing data in the memory device, the program code for storing the data in the memory device including: (a) program code for storing the data in a cache within the flash memory; (b) program code for copying a first portion of the data from the cache to a block of the flash memory that is separate from the cache; (c) program code for accessing the flash memory subsequent to the copying of the first portion of the data; and (d) program code for copying a second portion of the data from the cache to the block subsequent to the accessing; wherein the copying of the first portion of the data leaves a portion of the block unwritten, and wherein all of the portion of the block remains unwritten until after the accessing.

The methods of the present invention all involve storing data in a cache within a flash memory of a memory device, copying a first portion of the data from the cache to a memory block of the flash memory that is separate from the cache, then servicing an access (e.g. a read access or a write access) of the memory device by a host of the memory device, and then copying a second portion of the data from the cache to the memory block. To exclude from the scope of the present invention the execution of these steps in combination with erasing the block between the copying of the first data portion and the copying of the second data portion, the appended independent claims recite three limitations on the copying. The first limitation is that all the data to be copied are "selected" for copying. "Selecting" the data implies that it is desired that at the end of the copying, all the selected data are present in the block. The second limitation is simply that the block is not erased between the copying of the first data portion and the copying of the second data portion. The third limitation is that the copying of the first data portion leaves a portion of the block unwritten and that that entire portion of the block remains unwritten until after the host access is serviced.

Preferably, during both the first copying and the second copying, servicing of any accesses of the memory device by the host is suspended.

Preferably, after the copying of the second data portion, the data are erased from the cache.

Preferably, the data are stored in the cache as a first number of bits per cell and are written to the target block as a second, greater number of bits per cell.

Preferably, between the copying of the first data portion and the servicing of the host access, a control data structure of the memory device is updated to reflect the copying of the first data portion.

A memory device of the present invention includes a flash memory and a controller that stores data in the memory device using one of the methods of the present invention. A system of the present invention includes a memory device, a nonvolatile memory and a processor. In the nonvolatile memory is stored driver code for the memory device. The driver code includes code that, when executed by the processor, stores data in the memory device using one of the methods of the present invention. The scope of the present invention includes a computer-readable storage medium having embedded thereon such driver code.

Cache flushing is a special case of "garbage collection". "Garbage collection" generally refers to reclaiming space in a memory so that that space can be reused. It is known to interrupt garbage collection of a block of a flash memory to service an access of the memory by a host of the memory device that includes the flash memory. See e.g. Matthews et al., U.S. Pat. No. 5,860,124. The present invention is limited specifically to garbage collection for the purpose of reclaiming space in an input cache, i.e., in the context of cache flushing. Although it is known in the art to interrupt garbage collection of a flash memory block in contexts other than cache flushing, prior to the present invention it was not considered necessary to do the same in the context of cache flushing. General garbage collection is a low-priority operation that normally is done in background and that should be interrupted by higher-priority operations. Recall that the purpose of caching data that are input to a flash memory is to enable the flash memory to accept data from the host at a speed higher than the normal writing speed of the flash memory. Therefore, it conventionally has been thought that cache flushing should have at least as high a priority as any other flash memory operation, and in particular that cache flushing should have a higher priority than handling host accesses, because the cache must be kept available to receive high-speed data from the host. I have found that the factors noted above, such as the increased sizes of modern flash blocks and the increased programming time of modern flash pages, sometimes make it necessary to interrupt the flushing of a cache to a flash block in order to service a host access.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of flash memory cache flushing according to the present invention may be better understood with reference to the drawings and the accompanying description.

The present invention minimizes the length of the hiccups caused by cache flushing by breaking the flushing of a cache block of a flash memory into many separate and much shorter operations. In other words, the "quanta" of cache flushing are reduced from block-level to smaller units, typically at page-level.

When the flash management system completes a page-level cache flushing operation such as the copying of one page into its new location, the flash management system consolidates its control data structures so as to make these structures consistent with current storage contents, and then allows the host to issue a new command such as a command for writing a new page of data. The handling of the host command, including the storage of the new data into the cache of the flash memory, takes place immediately, before the flash memory system resumes cache flushing with the copying of another page into the block currently being filled by the cache flushing task. (One exception to this reduction of the quantization of cache flushing from blockwise to less-than-blockwise is the case of the cache being emptied to receive new data from the host because the cache is full.)

The result of this scheduling policy is that the maximal time interval in which a host is blocked from accessing the device becomes significantly shorter. Unlike the prior art systems discussed above that have blocking intervals of up to hundreds of milliseconds or even more, the methods of the present invention result in maximal blocking intervals of a few milliseconds, or at most a small multiple of tens of milliseconds. This is so because the blocking interval must be only long enough for accommodating the programming of a single page (or a small number of pages) plus some additional time for updating and keeping intact control data structures needed for managing the stored data and making sure the data are available and accessible at all times, even in the middle of cache flushing to a block.

Figure 2:
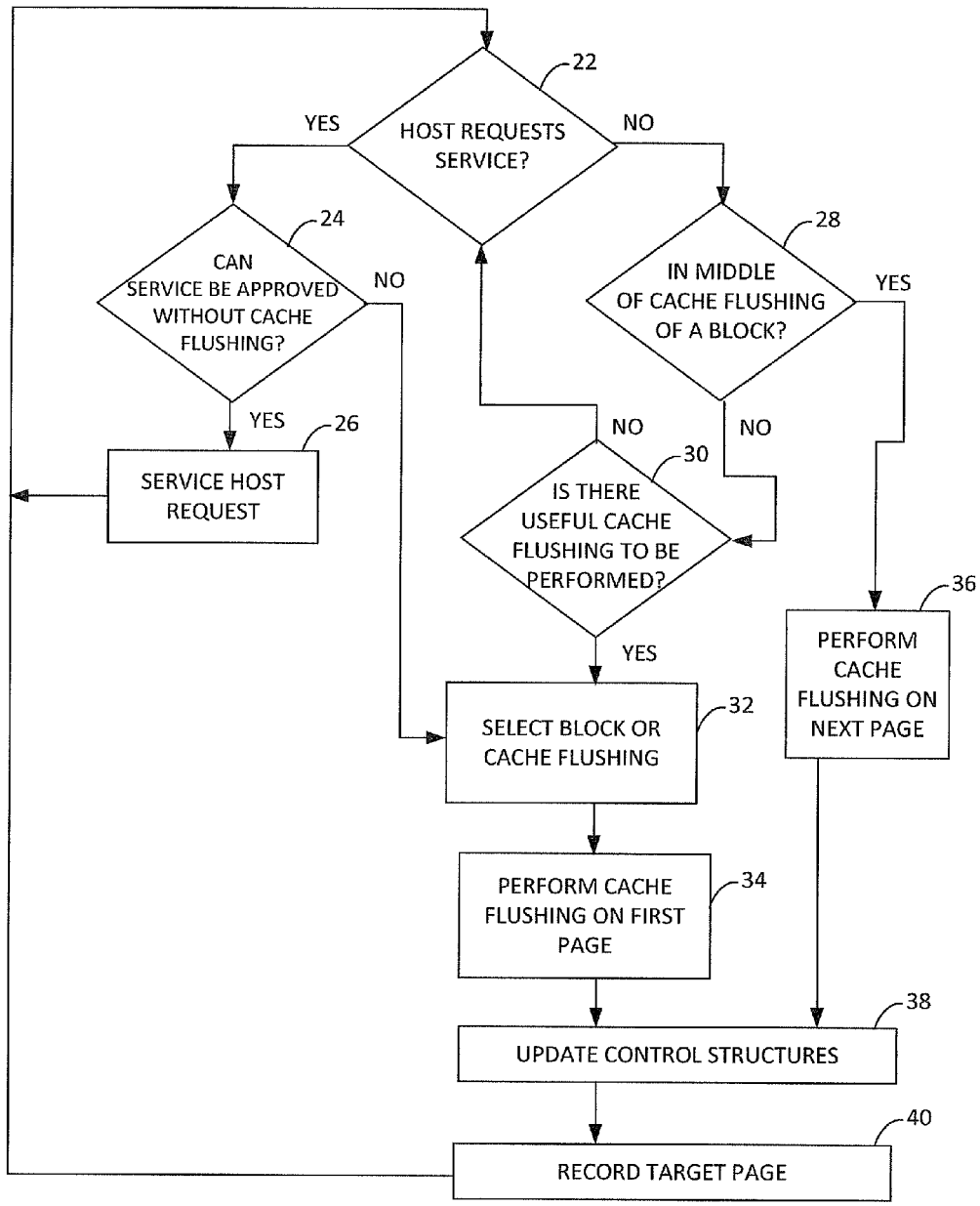
FIG. 2 is a flow chart of cache flushing according to the present invention.

Referring again to the drawings, FIG. 2 is a high level flow-chart of flash management operation according to the present invention. In block 22, the flash management system checks whether a service request from the host is pending. If such a request is pending, the flash management system checks in block 24 whether the service can be provided without cache flushing. If the service can be provided without cache flushing, the service is provided in block 26 and the operation returns to block 22. If no service request from the host is pending, the flash management system checks in block 28 whether the flash management system is in the middle of cache flushing to a block. (See the discussion of block 40 below for how this is done.)

If the flash management system is not in the middle of cache flushing to a block, the flash management system checks in block 30 whether there is useful cache flushing to be done. If there is no useful cache flushing to be done, the operation returns to block 22. If there is useful cache flushing to be done, or if the service requested by the host requires prior cache flushing, then in block 32 the flash management system selects a block for cache flushing, and in block 34 the flash management system performs cache flushing to the first page of the selected block. If the flash management system is in the middle of cache flushing to a block, the flash management system performs cache flushing to the next page of the block in block 36. No matter which page of the block cache flushing is performed to, the flash management system updates its control structures in block 38 to reflect the movement of data in block 34 or in block 36 and then, in block 40, records the number of the page to which cache flushing just has been performed. It is this recording that enables the flash management system to decide, in block 28, whether it is in the middle of cache flushing to a block. If the page to which cache flushing has most recently been performed is the last page of a block then the flash management system is not in the middle of cache flushing to any block.

Figure 1:
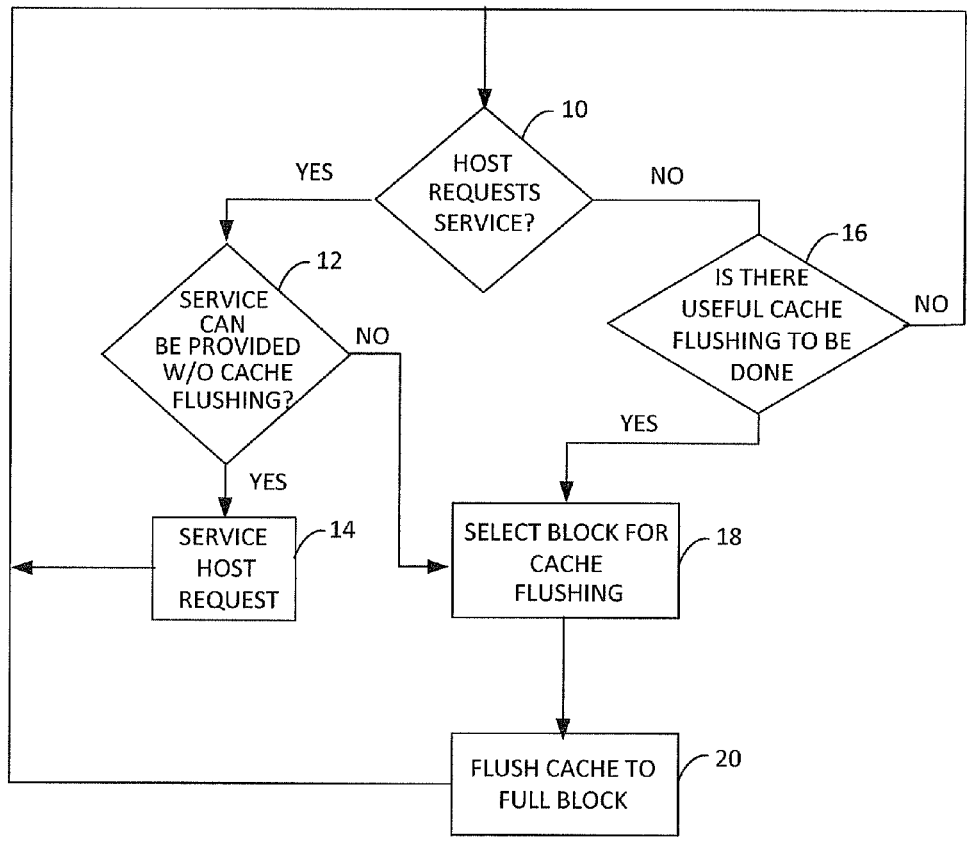
FIG. 1 is a flow chart of cache flushing according to the prior art.

As can be seen in FIG. 2, unlike FIG. 1, the host is serviced between any two pages handled as part of the cache flushing to the selected block. The example of FIG. 2 presents a case in which the atomic step of cache flushing (during which no host service is provided) is the writing of a single page. But it is also possible to have longer atomic steps, for example the writing of two consecutive pages, or the writing of any other number of consecutive pages. Typically the number of pages constituting an atomic cache flushing step is kept small, as otherwise the benefit of the method is reduced and the host is "starved" for a longer time. It should also be noted that the time of writing a page or a few pages also includes the time required for reading the data to be written into those pages from the cache. Erasing the block may also be one step within the many steps constituting cache flushing to a block. It is also possible for an atomic step to be less than full programming of a single page of the block. When using flash devices such those disclosed in U.S. Pat. No. 6,781,877 to Cernea et al., the writing of a page is performed by two write operations, with the writing of adjacent pages being interleaved. In such systems it is possible to have the atomic uninterruptible cache flushing step to be a single write command sent to the flash memory, thus achieving an atomic cache flushing step that is even shorter than the effective full programming time of a page of data.

As the scheduling of cache flushing atomic operations vs. the servicing of host access requests becomes more complicated in systems operating according to the methods of the present invention, it is advised to use a commercial off-the-shelf Real-Time Operating System (RTOS) for managing the scheduling of operations in a modular way. One such RTOS is "QNX Neutrino", available from QNX Software Systems of Ottawa Calif.

When applying the methods of the present invention, care must be taken to handle some complications that do not arise in the methods of the prior art but do arise in the present invention due to the more intricate interaction between cache flushing steps and host servicing activities. One such complication is the case in which the host writes new data addressed to the same block as is currently being flushed. In the prior art methods this is of no concern—the state of the block (or in other words—the data that the block should contain) is "frozen" once its cache flushing starts and there is no way external events such as host updates can change that state until the block is fully flushed into its new location. In the present invention, however, the host may update a page of data that "belongs" to the currently handled block. In other words, had those data been received before starting the cache flushing task, those data would have been included in the source state of the cache block. It is even possible that the host updates the same page several times in succession during the relatively long period of time in which a cache block is within an active cache flushing process. Such successive multiple updates are quite common for FAT tables or file system directories.

Even though the above scenarios do complicate to some extent the implementation of flash management software using the methods of the present invention, solutions exist in the prior art. U.S. patent application Ser. No. 11/219,826 to Lasser is one such solution (but is not the only one). U.S. Ser. No. 11/219,826 discloses a way of managing scenarios in which new updates arrive for data that are being copied between two locations in a storage device. U.S. Ser. No. 11/219,826 is hereby incorporated by reference for all purposes as if fully set forth herein. The "signatures" of U.S. Ser. No. 11/219,826 serve as identifiers of each update of the data, allowing the flash management software to always have a time-consistent picture of the contents of a block, even when the storage contains multiple versions of the same logical page that were stored at different points in time, each new version superseding the previous one. Therefore the flash management system is able to make a "data freeze" of the contents of the block, while still being able to keep any newer updates arriving from the host after that data freeze and eventually allowing the newer updates to supersede older data currently stored in the block.

The above discussion is closely related to the question of correctly locating data the host requests to read from a block currently being flushed. The methods of U.S. Ser. No. 11/219,826 provide an infrastructure sufficient for always correctly making the identification of the most recent copy of each page of data, but other solutions are also available in the prior art. The same is true of the question of protecting the integrity of the storage system if an unexpected power loss occurs in the middle of a cache flushing process taking place. The underlying principle in handling this issue is to back off from any operation for which it is not absolutely clear that the operation was successfully completed. In other words, the copy of the block that was under construction is abandoned, and as the source of the copied data is still available and was not deleted yet, nothing is lost and the same block can be cache flushed again from scratch. Again, this approach is supported by the methods of U.S. patent Ser. No. 11/219,826, but other approaches are also known in the prior art.

It should now be better understood why in FIG. 2 there is a need for the operation of "update control structures" (block 38) as part of the cache flushing process. Similar housekeeping operations are also performed as part of box 26, "Service Host Request", even though this is not explicitly shown in FIG. 2 for clarity.

It should be noted that while the above example of a caching flash management system is of a cache that uses SLC mode cells, the present invention is also equally applicable to caching flash management systems in which both cache cells and non-cache cells store multiple bits per cell, and the number of bits per cell in the cache cells is smaller than the number of bits per cell in the non-cache cells. The benefits of the caching architecture are available also in this more general case, as the lower the number of bits per cell the faster the writing into the cell.

The methods of the present invention are typically implemented by executing software. More specifically, the decisions regarding cache flush scheduling vs. host access scheduling are typically implemented by executing software. However, such execution may be either by the host computer that accesses the storage system for writing and reading (for example, by executing the code of the software device driver that supports the storage device), or by a memory controller, that interacts with the host computer on one side and controls the memory media on the other side, executing firmware. Both configurations are within the scope of the present invention, and are shown in FIGS. 3 and 4.

Figure 3:
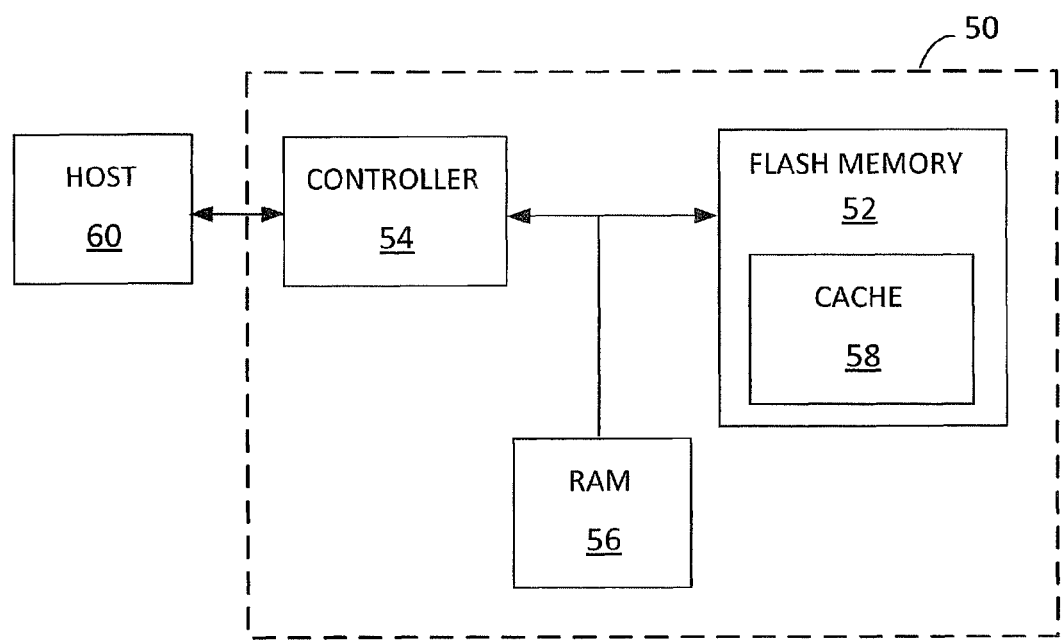
FIG. 3 is a high-level block diagram of a flash memory device of the present invention.

FIG. 3 is a high-level block diagram of a flash memory device 50 of the present invention coupled to a host 60. FIG. 3 is adapted from FIG. 1 of Ban, U.S. Pat. No. 5,404,485. Device 50 includes an MLC NAND flash memory 52, a flash memory controller 54 and a RAM 56. Part of flash memory 52 is used as a cache 58 for receiving data written to flash memory device 50 by host 60. As described above in the Field and Background section, cache 58 may be either mixed or dedicated. Controller 54, that corresponds to "flash control 14" of U.S. Pat. No. 5,404,485, manages memory 52 with the help of RAM 56 using prior art methods such as those taught in U.S. Pat. No. 5,404,485 and in Ban, U.S. Pat. No. 5,937, 425. (U.S. Pat. No. 5,404,485 is for flash memories generally. U.S. Pat. No. 5,937,425 is specific to NAND flash memories). Both U.S. Pat. Nos. 5,404,485 and 5,937,425 are incorporated by reference for all purposes as if fully set forth herein. Controller 54 also performs cache flushing in memory 52 using one or more of the methods of the present invention.

Figure 4:
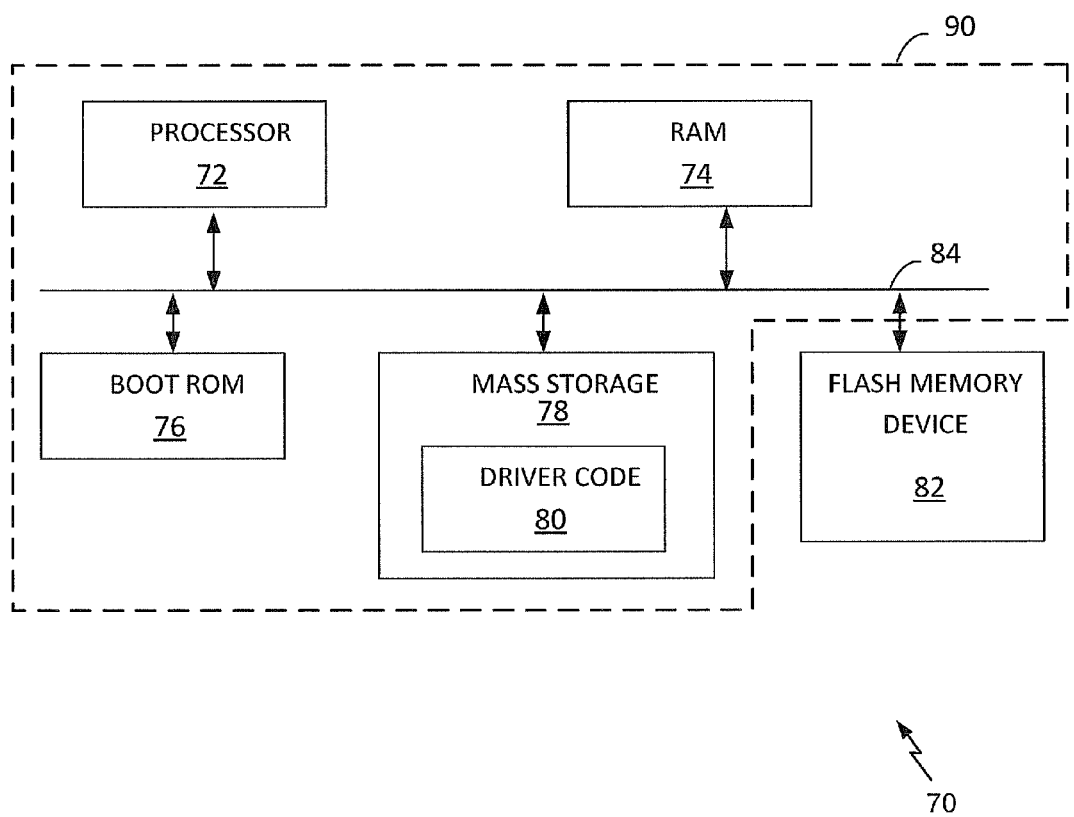
FIG. 4 is a high-level block diagram of a system of the present invention.

FIG. 4 is a high-level block diagram of a system 70 of the present invention. System 70 includes a processor 72 and four memory devices: a RAM 74, a boot ROM 76, a mass storage device (hard disk) 78 and a flash memory device 82, all communicating via a common bus 84. Flash memory driver code 80 is stored in mass storage device 78 and is executed by processor 72 to interface between user applications executed by processor 72 and flash memory device 82, and to manage the flash memory of flash memory device 82. In addition to the conventional functionality of such flash management driver code, driver code 80 emulates the functionality of controller 54 of FIG. 3 with respect to implementing the methods of the present invention. Driver code 80 typically is included in operating system code for system 70 but also could be freestanding code.

The components of system 70 other than flash memory device 82 constitute a host 90 of flash memory device 82. Mass storage device 78 is an example of a computer-readable storage medium bearing computer-readable driver code for implementing the present invention. Other examples of such computer-readable storage media include read-only memories such as CDs bearing such code.

While the invention has been described with respect to a limited number of embodiments, it will be appreciated that many variations, modifications and other applications of the invention may be made.

What is claimed is:

1. A method of storing data in a memory device that includes a flash memory, the method comprising:
storing the data in a cache block, wherein a part of the flash memory is used as the cache block;
selecting a portion of the data for copying to a write block of the flash memory that is separate from the cache block;

copying a first subportion of a plurality of subportions of the selected portion of the data from a first part of the cache block to the write block, wherein the first part of the cache block is accessible after the copying of the first subportion to the write block and prior to copying a second subportion of the plurality of subportions of the selected portion of the data from a second part of the cache block to the write block;

subsequent to the copying of the first subportion, servicing a request to access the memory device, wherein the request is received from a host of the memory device;

recording a page number of a page of the cache block; and subsequent to the servicing of the request, using the page number to resume copying the data from the cache block, wherein the resumed copying includes copying the second subportion from the second part of the cache block to the write block.

2. The method of claim 1, further comprising:
suspending servicing of any requests received from the host to access the memory device during the copying of the first subportion; and
suspending servicing of any accesses of the memory device by the host during the copying of the second subportion.

3. The method of claim 1, further comprising:
subsequent to the copying of the second subportion, erasing the selected portion of the data from the cache block.

4. The method of claim 1, further comprising:
subsequent to the copying of the first subportion and prior to the servicing, updating a control data structure of the memory device to reflect the copying of the first subportion.

5. The method of claim 4, further comprising consolidating the control data structure along with a plurality of control data structures.

6. The method of claim 1, further comprising determining whether a cache flushing task is executing when the request is received.

7. The method of claim 6, further comprising determining whether the page is a last page of the cache block.

8. The method of claim 1, wherein copying the portion of the data to the block of the flash memory is performed as a first cache flushing task and wherein, in response to determining that the request to access the memory device is not serviceable without cache flushing the cache block, the first cache flushing task is interrupted to perform a second cache flushing task to enable servicing of the request to access the memory device.

9. The method of claim 1, wherein the page is other than a last page of the cache block.

10. A memory device comprising:
a flash memory; and
a controller operative to store data in the flash memory by:
storing the data in a cache block, wherein a part of the flash memory is used as the cache block;
selecting a portion of the data for copying to a write block of the flash memory that is separate from the cache block;
copying a first subportion of a plurality of subportions of the selected portion of the data from a first part of the cache block to the write block, wherein the first part of the cache block is accessible after the copying of the first subportion to the write block and prior to copying a second subportion of the plurality of subportions of the selected portion of the data from a second part of the cache block to the write block;

subsequent to the copying of the first subportion, servicing a request to access the memory device, wherein the request is received from a host of the memory device;

recording a page number of a page of the cache block; and subsequent to the servicing of the request, using the page number to resume copying the data from the cache block, wherein the resumed copying includes copying the second subportion from the second part of the cache block to the write block.

11. The memory device of claim 10, further comprising:
a control data structure for managing the flash memory; and wherein the controller is further operative:
subsequent to the copying of the first subportion and prior to the servicing, to update the control data structure to reflect the copying of the first subportion.

12. The memory device of claim 10, wherein the data is stored in the cache block as a first number of bits per cell and wherein the copying writes the first and second subportions to the write block as a second number of bits per cell, the first number being more than one and the second number being greater than the first number.

13. The memory device of claim 10, wherein the cache block is part of a dedicated cache within the flash memory.

14. The memory device of claim 13, wherein the dedicated cache includes one or more cells and wherein each cell of the dedicated cache is used exclusively in a single-level cell mode.

15. The system of claim 14, wherein the dedicated cache includes one or more cells and wherein each cell of the dedicated cache is used exclusively in a single-level cell mode.

16. A system comprising:
a memory device that includes a flash memory;
a nonvolatile memory that stores driver code for the memory device, the driver code including code for storing data in the memory device, the code for storing the data in the memory device including:
code for storing the data in a cache block within the flash memory;
code for selecting a portion of the data for copying to a write block of the flash memory that is separate from the cache block;
code for copying a first subportion of a plurality of subportions of the selected portion of the data from a first part of the cache block to the write block, wherein the first part of the cache block is accessible after the copying of the first subportion to the write block and prior to copying a second subportion of the plurality of subportions of the selected portion of the data from a second part of the cache block to the write block;
code for accessing the flash memory subsequent to the copying of the first subportion;
code for recording a page number of a page of the cache block; and
code for subsequent to the accessing, using the page number to resume copying the data from the cache block, wherein the resumed copying includes copying the second subportion from the second part of the cache block to the write block; and
a processor for executing the driver code.

17. The system of claim 16, wherein the memory device includes a control data structure for managing the flash memory, and wherein the code for storing the data in the memory device further includes code for updating the control data structure, subsequent to the copying of the first subportion and prior to the accessing, to reflect the copying of the first subportion.

18. The system of claim 16, wherein the data is stored in the cache block as a first number of bits per cell and wherein the copying writes the first and second subportions to the write block as a second number of bits per cell, the first number being more than one and the second number being greater than the first number.

* * * * *